(12) United States Patent
Zhang et al.

(10) Patent No.: US 9,117,734 B2
(45) Date of Patent: Aug. 25, 2015

(54) INTEGRATED CIRCUIT ARCHITECTURE FOR LIGHT EMITTING DIODE-BASED DISPLAYS

(71) Applicant: Marvell World Trade LTD., St. Michael (BB)

(72) Inventors: Wanfeng Zhang, Palo Alto, CA (US); Albert Wu, Palo Alto, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/299,465

(22) Filed: Jun. 9, 2014

(65) Prior Publication Data

US 2014/0284635 A1    Sep. 25, 2014

Related U.S. Application Data

(63) Continuation of application No. 12/965,001, filed on Dec. 10, 2010, now Pat. No. 8,748,910.

(60) Provisional application No. 61/288,221, filed on Dec. 18, 2009, provisional application No. 61/328,567, filed on Apr. 27, 2010.

(51) Int. Cl.
*H01L 33/00* (2010.01)
*H01L 27/15* (2006.01)
*H05B 33/08* (2006.01)

(52) U.S. Cl.
CPC .......... *H01L 27/156* (2013.01); *H05B 33/0806* (2013.01)

(58) Field of Classification Search
CPC ....... H01L 27/156; H01L 33/00; H01L 33/62; H01L 25/0753; H01L 27/153
USPC .................... 257/88, 98, 99; 438/28
See application file for complete search history.

(56) References Cited

U.S. PATENT DOCUMENTS

| 8,102,107 B2 | 1/2012 | Hsieh |
| 2005/0012457 A1 | 1/2005 | Wu |
| 2005/0112801 A1 | 5/2005 | Russell et al. |

(Continued)

FOREIGN PATENT DOCUMENTS

| JP | H09-026530 | 1/1997 |
| JP | 2005-521205 A | 7/2005 |

(Continued)

OTHER PUBLICATIONS

Japanese Office Action for Japanese Patent Application No. 2012-544730 dated Apr. 22, 2014.

*Primary Examiner* — Phuc Dang

(57) ABSTRACT

An integrated circuit including a die of the integrated circuit, the die including an insulating layer, light emitting diodes, a semiconductor layer, and a control module. The insulating layer includes a first side and a second side. The second side is opposite to the first side. The light emitting diodes are arranged on the first side of the insulating layer. The semiconductor layer is arranged adjacent to the second side of the insulating layer. The light emitting diodes are connected to the semiconductor layer using connections from the first side of the insulating layer to the second side of the insulating layer. The control module is arranged on the semiconductor layer. The control module is configured to output pulse width modulated pulses to the light emitting diodes via the connections.

20 Claims, 4 Drawing Sheets

(56) References Cited

U.S. PATENT DOCUMENTS

| | | |
|---|---|---|
| 2006/0022214 A1 | 2/2006 | Morgan et al. |
| 2007/0034899 A1 | 2/2007 | Petruzzello et al. |
| 2007/0139316 A1 | 6/2007 | Hyatt |
| 2008/0099770 A1 | 5/2008 | Mendendorp et al. |
| 2009/0021180 A1 | 1/2009 | Underwood et al. |
| 2010/0012960 A1* | 1/2010 | Chang .............................. 257/98 |
| 2010/0059785 A1* | 3/2010 | Lin et al. .......................... 257/99 |
| 2010/0079990 A1* | 4/2010 | Helbing ......................... 362/235 |
| 2013/0033885 A1* | 2/2013 | Oh et al. ........................ 362/516 |
| 2013/0271029 A1* | 10/2013 | Liao et al. ..................... 315/294 |

FOREIGN PATENT DOCUMENTS

| | | |
|---|---|---|
| JP | 2006-019594 A | 1/2006 |
| JP | 2006-237104 A | 9/2006 |
| JP | 2006-245336 A | 9/2006 |
| JP | 2008-507150 A | 3/2008 |

* cited by examiner

INTEGRATED CIRCUIT ARCHITECTURE FOR LIGHT EMITTING DIODE-BASED DISPLAYS

CROSS-REFERENCE TO RELATED APPLICATIONS

This application is a continuation of U.S. patent application Ser. No. 12/965,001 (now U.S. Pat. No. 8,748,910), filed Dec. 10, 2010, which claims the benefit of U.S. Provisional Application No. 61/288,221 filed on Dec. 18, 2009 and U.S. Provisional Application 61/328,567 filed on Apr. 27, 2010. The disclosures of the above applications are incorporated herein by reference in their entirety.

FIELD

The present disclosure relates generally to LED-based displays and more particularly to integrated buck power supply architectures for LED-based displays.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A PN junction of a light emitting diode (LED) emits light when the PN junction is forward-biased. Generally, LEDs are energy-efficient, reliable, low-maintenance, and environmentally friendly. Accordingly, LED-based displays (luminaires) are used in a variety of residential and commercial applications. For example, the displays are used in microwave ovens, advertising signs, industrial control panels, street lights, and so on.

Luminosity of LEDs is typically a function of a forward current through the PN junction when the PN junction is forward-biased. Additionally, the luminosity is a function of a temperature of the PN junction (junction temperature). A forward voltage applied across the PN junction determines the forward current through the PN junction. The forward voltage is also a function of the junction temperature.

An LED controller controls current through the LEDs based on changes in the junction temperature. By controlling the current, the LED controller maintains the luminosity of the LEDs at a predetermined level. Different types of switch mode power supply (SMPS) are used to supply power to the LEDs. For example, the SMPS may include a buck SMPS, a boost SMPS, a flyback SMPS, etc.

SUMMARY

A system includes a plurality of light emitting diodes (LEDs) and a control module configured to generate pulse width modulated (PWM) pulses to drive the LEDs. The LEDs and the control module are integrated in an integrated circuit (IC) package.

In other features, the LEDs are un-encapsulated, and the LEDs are connected to each other in series.

In other features, the LEDs and the control module are arranged on a die in the IC package. The die includes a ceramic layer having a first side, and a second side that is opposite to the first side, and a silicon layer. The LEDs are arranged adjacent to the first side of the ceramic layer. The silicon layer includes the control module. The silicon layer is adjacent to the second side of the ceramic layer. The LEDs are electrically connected to the silicon layer.

In other features, the LEDs are electrically connected to the silicon layer using through holes in the ceramic layer or using bond wires.

In other features, the die further includes a plurality of Zener diodes. At least one of the Zener diodes is connected across a corresponding one of the LEDs. The Zener diodes are arranged adjacent to the first side of the ceramic layer or in the silicon layer.

In another feature, the first side of the ceramic layer is coated with a reflective material.

In other features, the die further includes a metal core layer including at least one of an inductance and a capacitance of a buck power supply configured to supply power to the LEDs based on the PWM pulses generated by the control module. The metal core layer is arranged on an opposite side of the silicon layer relative to the ceramic layer.

In other features, the LEDs are arranged on a first die in the IC package, and the control module is arranged on a second die in the IC package.

In other features, the first die further includes a plurality of Zener diodes. At least one of the Zener diodes is connected across a corresponding one of the LEDs.

In other features, the second die includes a ceramic layer having a first side that is adjacent to the first die and a second side that is opposite to the first side, and a silicon layer. The silicon layer includes the control module. The silicon layer is adjacent to the second side of the ceramic layer. The LEDs are electrically connected to the silicon layer. The LEDs are electrically connected using bond wires.

In other features, the second die further includes a metal core layer including at least one of an inductance and a capacitance of a buck power supply configured to supply power to the LEDs based on the PWM pulses generated by the control module. The metal core layer is arranged on an opposite side of the silicon layer relative to the ceramic layer.

In other features, the IC package has a first side that is adjacent to the LEDs and a second side that is opposite to the first side. The second side has an exposed pad.

In other features, the IC package has a first side that is adjacent to the LEDs and a second side that is opposite to the first side. A heat sink is attached to the second side.

In another feature, a size of the IC package is determined based on a lumens-per-watt rating of the LEDs.

In another feature, a size of the IC package is inversely proportional to a lumens-per-watt rating of the LEDs.

In another feature, the LEDs and the control module are integrated in the IC package using a single packaging process.

In still other features, a method includes arranging a plurality of light emitting diodes (LEDs) in an integrated circuit (IC) package, and generating pulse width modulated (PWM) pulses to drive the LEDs using a control module. The LEDs and the control module are integrated in the IC package. The LEDs are unencapsulated and are connected to each other in series. The method further includes arranging a plurality of Zener diodes in the IC package; connecting at least one of the Zener diodes across a corresponding one of the LEDs; and integrating the LEDs, the control module, and the Zener diodes in the IC package using a single packaging process.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
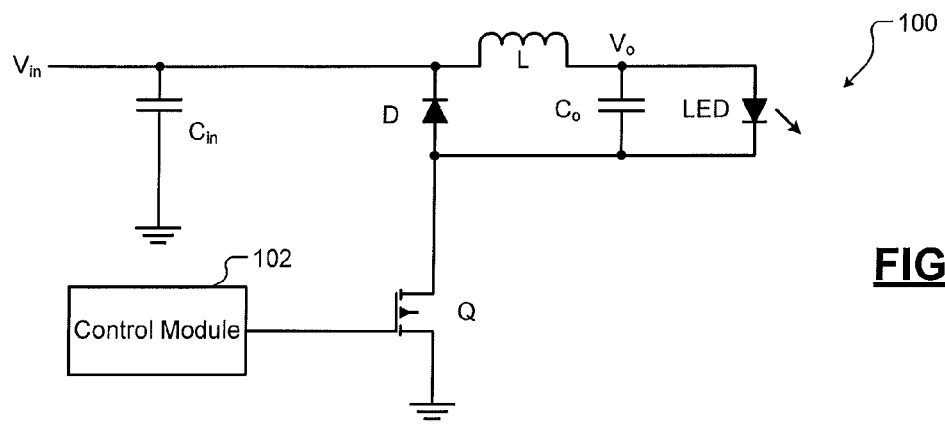
FIG. 1 is a schematic of a buck power supply for an LED.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

Referring now to FIG. 1, a typical buck power supply 100 for an LED is shown. The buck power supply 100 includes a control module 102, a transistor Q, a diode D, an inductance L, an input capacitance $C_{in}$, an output capacitance $C_o$, and an LED as a load. The capacitances $C_{in}$ and $C_o$ and the inductance L are passive components of the buck power supply 100.

An AC/DC converter or a DC/DC converter (not shown) supplies an input voltage $V_{in}$ to the buck power supply 100. The buck power supply 100 generates an output voltage $V_o$ across the LED. The input capacitance $C_{in}$ filters the input voltage $V_{in}$. The output capacitance $C_o$ filters the output voltage $V_o$ The control module 102 generates pulses using pulse width modulation (PWM) to drive the transistor Q at a predetermined duty cycle. When the transistor Q is on, current flows though the inductance L, the LED, and the transistor Q. When the transistor Q is off, current flows through the inductance L, the LED, and the diode D.

In the buck power supply 100, the input capacitance $C_{in}$ and the output capacitance $C_o$ are generally electrolytic capacitances. The life of electrolytic capacitances is typically on the order of 103 hours. In contrast, LEDs have a typical mean time between failures (MTBF) on the order of 105 to 106 hours. Since the electrolytic capacitances have a shorter life than the LEDs, LED-based displays utilizing electrolytic capacitances tend to have a shorter life than the life of LEDs.

Additionally, the size of electrolytic capacitances and the quality of filtering performed by electrolytic capacitances are proportional to the values of these capacitances. In other words, larger electrolytic capacitances are typically used for greater filtering. Accordingly, while some components of the buck power supply can be integrated into an integrated circuit (IC), the electrolytic capacitances cannot be integrated into an IC. Further, packaging the silicon-based components of the buck power supply in an IC package involves a different packaging process than packaging LEDs. Accordingly, packaging LEDs and the silicon-based components of the buck power supply in an IC package can be problematic.

The present disclosure relates to using a single packaging process to package LEDs and the silicon-based components of the buck power supply into an IC package. Specifically, un-encapsulated LEDs (i.e., LEDs that are not encapsulated with a material such as a resin or lens; in other words, silicon-based portions of the LEDs) and the silicon-based components of the buck power supply can be arranged on a die. The die is packaged in an IC package.

Alternatively, the un-encapsulated LEDs can be arranged on a first die, and the silicon-based components of the buck power supply can be arranged on a second die. The first die is electrically connected to the second die using through holes, wire bonding, or other types of connections. The first die and the second die are packaged in an IC package.

A ceramic layer can be provided between a layer including the un-encapsulated LEDs and a silicon layer including the silicon-based components of the buck power supply. The ceramic layer compensates for differences between coefficients of expansion of the layer including the LEDs and the silicon layer. Additionally, an optional heat sink or an exposed pad (E-pad) can be provided on the IC package to dissipate heat.

Further, life of the LED-based displays can be increased by using non-electrolytic capacitances as input and output filter capacitances in the buck power supply. For example, ceramic or thin-film capacitances may be used instead of the electrolytic capacitances. The non-electrolytic capacitances and the inductance of the buck power supply can be integrated on a metal core layer of the IC package.

Figure 2:
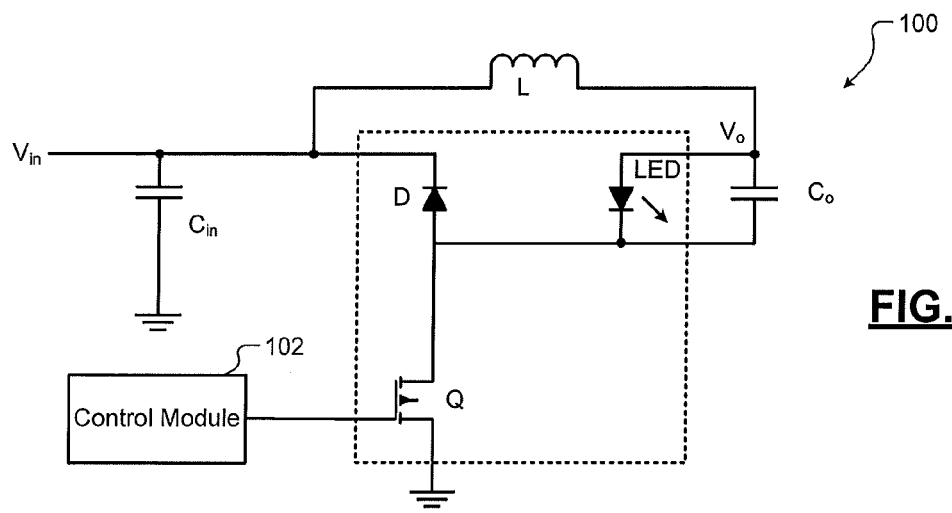
FIG. 2 is a schematic of a buck power supply for an LED showing integration of transistor Q, diode D, and LED.
Figure 3:
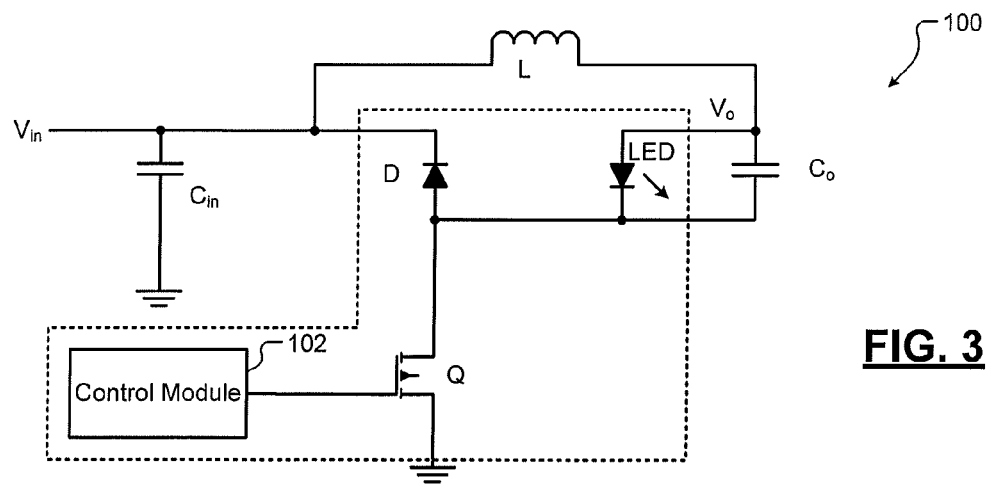
FIG. 3 is a schematic of a buck power supply for an LED showing integration of transistor Q, diode D, LED, and a control module.
Figure 4:
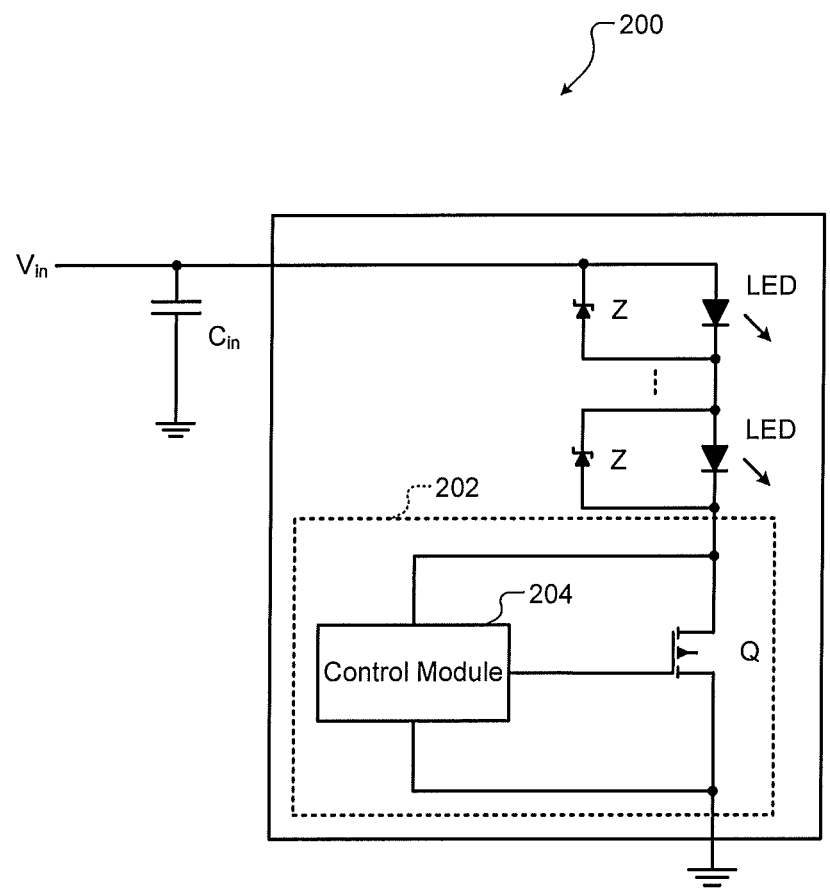
FIG. 4 is a schematic of a linear power supply for LEDs showing integration of an LED string and a linear regulator.

Referring now to FIGS. 2-4, different components of the buck power supply can be integrated in an IC package. Typically, different packaging processes are used to integrate different types of silicon-based components in an IC package. For example, a first packaging process may be used to integrate transistors and diodes in an IC package while a second packaging process that is different than the first packaging process may be used to integrate LEDs in the IC package. According to the present disclosure, however, a single packaging process may be used to integrate LEDs and other silicon-based components of the buck power supply in an IC package. Further, the IC package includes a metal core layer used to implement passive components of the buck power supply. The metal core layer also dissipates heat generated by the LEDs and other components of the IC package. The metal core layer may comprise aluminum or copper alloy, iron alloy, or carbon. The composition of the metal core layer depends on factors including heat dissipation and weight of the IC package.

For example, in FIG. 2, the diode D, the transistor Q, and the LED can be integrated in an IC package, and a single packaging process may be used to integrate the diode D, the transistor Q, and the LED on a die. Further, the passive components (i.e., the inductance L and the capacitances $C_{in}$ and $C_o$) can be integrated in a metal core layer of the IC package.

In FIG. 3, in addition to the diode D, the transistor Q, and the LED, the control module 102 can be integrated on the die. Again, a single packaging process may be used to integrate the diode D, the transistor Q, the LED, and the control module 102 on the die. Further, the passive components (i.e., the inductance L and the capacitances $C_{in}$ and $C_o$) can be integrated in a metal core layer of the IC package.

In FIGS. 2 and 3, the capacitances $C_{in}$ and $C_o$ are non-electrolytic capacitances. For example, the capacitances $C_{in}$ and $C_o$ can include ceramic or thin-film capacitances. When an AC/DC converter supplies the input voltage $V_{in}$, the input capacitance $C_{in}$ can be selected as follows. The input capacitance $C_{in}$ can have a value that is sufficient to hold the input voltage $V_{in}$ greater than the output voltage $V_o$. When a DC/DC converter supplies the input voltage $V_{in}$, the input voltage $V_{in}$ is greater than the output voltage $V_o$. Further, the control module 102 can provide power-factor correction.

In FIG. 4, a linear power supply 200 for an LED string is shown. The LED string includes a plurality of LEDs connected in series. A Zener diode (Z) is connected across each LED as shown. The Zener diode conducts current when an LED connected across the Zener diode malfunctions. Thus, the LED string is not rendered useless when an LED in the LED string malfunctions.

The linear power supply 200 includes a linear regulator 202. The linear regulator 202 includes a control module 204 and a transistor Q. The control module 204 generates a control signal to drive the transistor Q at a predetermined amplitude. The linear regulator 202 controls current through the LED string as a constant.

The linear regulator 202, the LED string, and the Zener diodes can be integrated into an IC package. The linear regulator 202, the LED string, and the Zener diodes can be integrated on a die using a single packaging process. Alternatively, the LED string can be arranged on a first die, and the linear regulator 202 can be arranged on a second die. The Zener diodes can be included in the first die or the second die. The first die is electrically connected to the second die using through holes, wire bonding, or other types of connections. The first die and the second die are packaged in an IC package using a single packaging process.

Unlike the buck power supply 100, the linear power supply 200 does not use an inductance L, a diode D, or an output capacitance $C_o$. The input capacitance $C_{in}$ of the buck power supply 200 can include a ceramic or a thin-film capacitance. The input capacitance $C_{in}$ can be integrated in a metal core layer of an IC package.

Figure 5A:
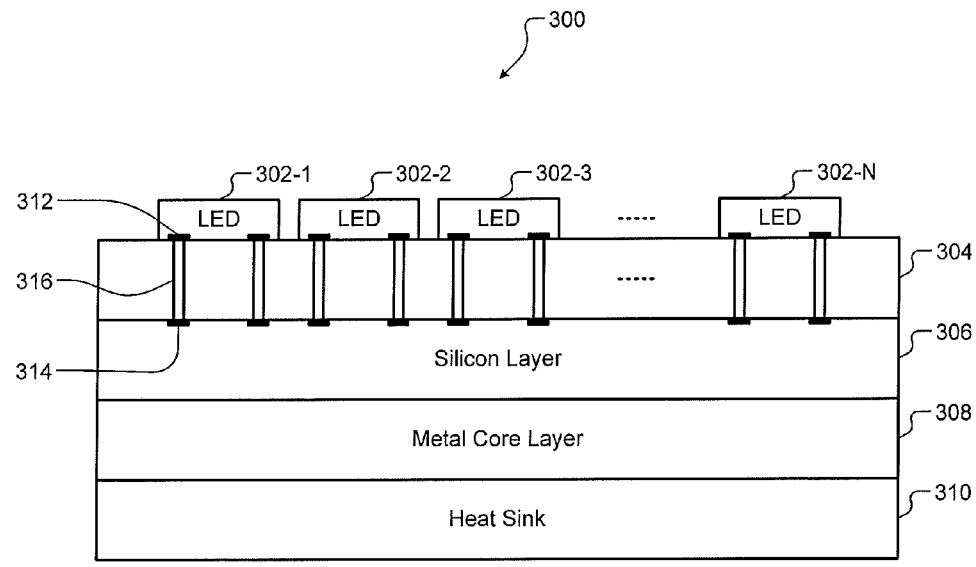
FIGS. 5A-5D depict different configurations of integrated circuit (IC) packages comprising LEDs and components of a buck power supply or linear power supply for the LEDs.
Figure 5B:
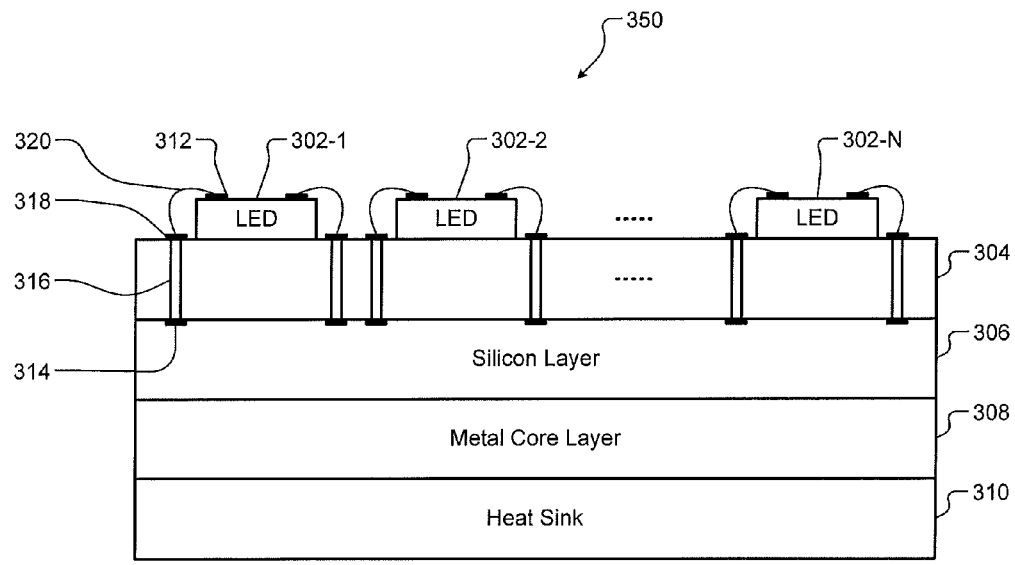
Figure 5C:
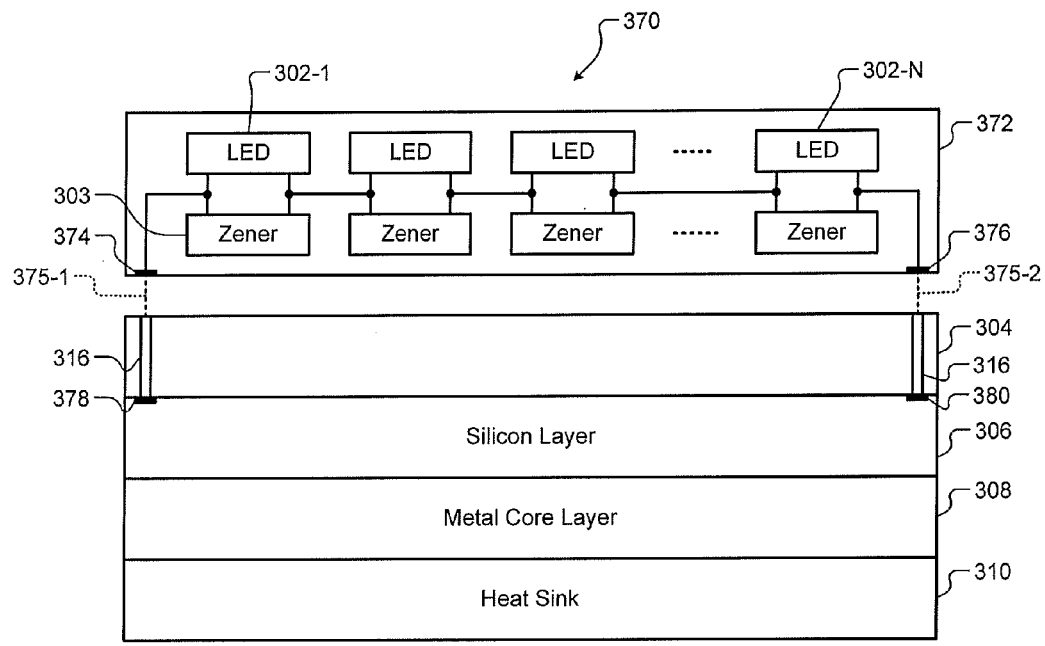
Figure 5D:
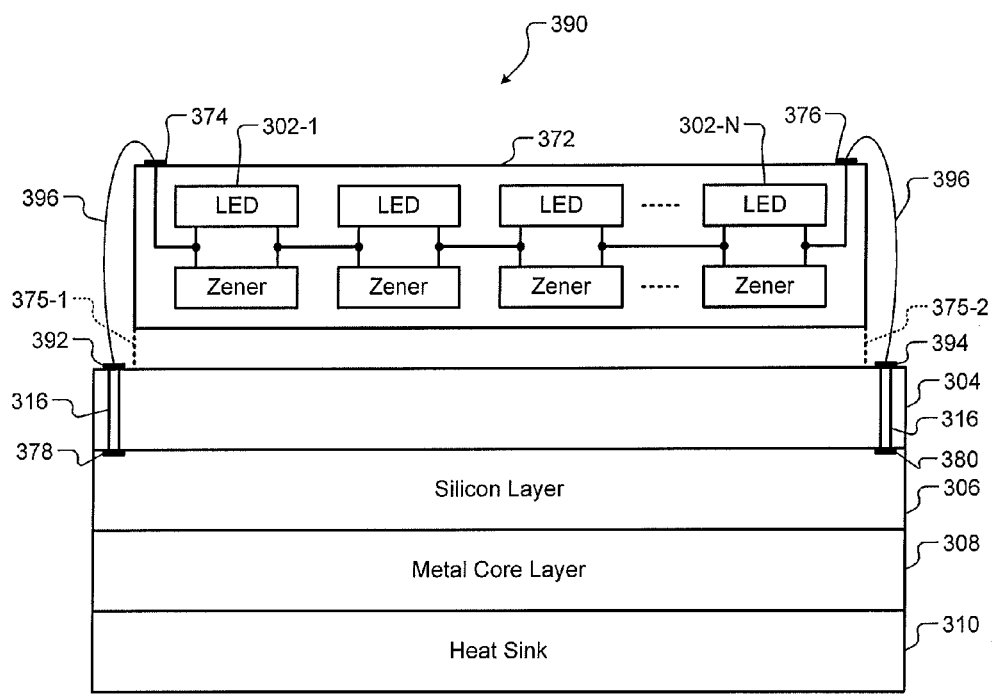

Referring now to FIGS. 5A-5D, IC packages comprising LEDs and one or more components of the buck power supply 100 or linear power supply 200 are shown. The LEDs shown are un-encapsulated. FIGS. 5A and 5B show IC packages where the LEDs and one or more components of the buck power supply 100 or linear power supply 200 are arranged on a single die. FIGS. 5C and 5D show IC packages where the LEDs are arranged on a first die and one or more components of the buck power supply 100 or linear power supply 200 are arranged on a second die.

In FIGS. 5A-5D, elements referenced by reference numerals are shown for illustrative purposes only. The elements are not drawn to any scale. The drawings do not represent actual geometries of the elements shown. In the following discussion, the LEDs and the linear power supply 200 shown in FIG. 4 are used for example only. The teachings described below are also applicable to integrating one or more LEDs and one or more components of the buck power supply 100 shown in FIGS. 2 and 3.

In FIG. 5A, an IC package 300 includes LEDs 302-1, 302-2, ..., and 302-N (collectively LEDs 302), where N is an integer greater than 1. Additionally, the IC package 300 includes a ceramic layer 304, a silicon layer 306, a metal core layer 308, and a heat sink 310. The heat sink 310 is optional. The LEDs 302, the ceramic layer 304, the silicon layer 306, and the metal core layer 308 are arranged on a single die.

The ceramic layer 304 provides a buffer between the LEDs 302 and the silicon layer 306. The ceramic layer 304 compensates for differences between coefficients of expansion of the LEDs 302 and the silicon layer 306. A side of the ceramic layer 304 adjacent to the LEDs 302 can be coated with a reflective material to reflect light emitted by the LEDs 302. The reflective coating can include a layer of titanium dioxide ($TiO_2$), a silver coating, a metal coating, or a mirror coating, for example.

The silicon layer 306 includes the linear regulator 202 of the linear power supply 200 and the Zener diodes (collectively silicon-based components of the linear power supply 200). Additionally, the silicon layer 306 can include an electrostatic discharge (ESD) protection for the LEDs 302 and the silicon-based components of the linear power supply 200. Contacts 312 of the LEDs 302 may be electrically connected to contacts 314 of the silicon layer 306 using through holes with bonds 316 in the ceramic layer 304 as shown.

The metal core layer 308 includes passive components of the linear power supply 200 (e.g., the capacitance CO. The heat sink 310 is optional. Alternatively, an exposed-pad (E-pad) (not shown), which is an exposed metal plate of an IC package, can be used. The E-pad is typically plated with the same metal (e.g., tin) or alloy as leads of the IC package. The E-pad is soldered directly on a printed circuit board (PCB). The E-pad increases power dissipation capabilities of the 1C package.

In FIG. 5B, an IC package 350 uses bond wires. Contacts 312 of the LEDs 302 are electrically connected to contacts 314 of the silicon layer 306 using bond wires 320 as follows. Contacts 312 of the LEDs 302 are electrically connected to contacts 318 on the ceramic layer 304 using bond wires 320. Contacts 318 of the ceramic layer 304 are electrically connected to contacts 314 of the silicon layer 306 using through holes with bonds 316 in the ceramic layer 304 as shown. The IC package 350 includes the ceramic layer 304, the silicon layer 306, the metal core layer 308, the optional heat sink 310, etc. as described with reference to FIG. 5A.

In FIG. 5C, an IC package 370 includes two dies. A first die 372 includes the LEDs 302 and Zener diodes 303 connected as shown. A second die includes the ceramic layer 304, the silicon layer 306 comprising the linear regulator 202 of the linear power supply 200, and the metal core layer 308. While the two dies are shown separated by dotted lines 375-1 and 375-2 for illustrative purposes, the two dies are in electrical and/or thermal contact with each other. The heat sink 310 is optional. Alternatively, an E-pad can be used.

A first end of the string of LEDs 302 is connected to a contact 374 on the first die 372. A second end of the string of LEDs 302 is connected to a contact 376 on the first die 372. Contacts 374 and 376 are electrically connected to contacts 378 and 380 of the silicon layer 306, respectively, using through holes with bonds 316 in the ceramic layer 304 as shown.

In FIG. SD, an IC package 390 includes two dies as described with reference to FIG. 5C. The IC package 390 uses bond wires. Contacts 374 and 376 are electrically connected to contacts 392 and 394 on the ceramic layer 304 using bond wires 396. Contacts 392 and 394 of the ceramic layer 304 are electrically connected to contacts 378 and 380 of the silicon layer 306 using through holes with bonds 316 in the ceramic layer 304 as shown.

In the IC packages 300, 350, 370, and 390, the size of one or more dies (i.e., die size) on which the LEDs 302 and components of the linear power supply 200 are integrated depends on a lumens-per-watt rating of the LEDs 302. Consequently, the size of the IC packages 300, 350, 370, and 390 also depends on the lumens-per-watt rating of the LEDs 302.

Specifically, the die size (and the size of the IC package) is inversely proportional to the lumens-per-watt rating of the LEDs 302. This is because, as the lumens-per-watt rating of the LEDs 302 increases, fewer LEDs can emit a desired amount of light. Since fewer LEDs are used, less heat is generated by the LEDs 302. Accordingly, the higher the lumens-per-watt rating of the LEDs 302, the smaller the die size and the size of the IC packages 300, 350, 370, and 390.

Alternatively, when LEDs having a relatively low lumens-per-watt rating are used, more LEDs are necessary to emit the desired amount of light. As the number of LEDs 302 increases, the amount of heat generated by the LEDs 302 also increases. Accordingly, when LEDs having relatively low lumens-per-watt rating are used, heat sinks or E-pads can be used to dissipate the heat generated by the LEDs 302.

Although not shown, in the IC packages 300, 350, 370, and 390, the LEDs 302 can be electrically connected to the silicon-based components in the silicon layer 306 in other ways (e.g., using flip-chip bonding). Further, Au—Sn eutectic bonding, which is a type of wafer-level bonding, can be used to bond a die and a substrate of the IC packages 300, 350, 370, and 390. A substrate is a supporting material on which circuits are formed or fabricated. The Au—Sn eutectic bonding provides electrical contacts between the die and the substrate. Additionally, the Au—Sn eutectic bonding provides mechanical support to the die and improves heat dissipation capabilities of the IC packages.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An integrated circuit comprising:
a die of the integrated circuit, the die comprising:
an insulating layer including a first side and a second side, wherein the second side is opposite to the first side;
light emitting diodes arranged on the first side of the insulating layer;
a semiconductor layer arranged adjacent to the second side of the insulating layer, wherein the light emitting diodes are connected to the semiconductor layer using connections from the first side of the insulating layer to the second side of the insulating layer; and
a control module arranged on the semiconductor layer, wherein the control module is configured to output pulse width modulated pulses to the light emitting diodes via the connections.

2. The integrated circuit of claim 1, wherein the light emitting diodes are un-encapsulated.

3. The integrated circuit of claim 1, wherein the light emitting diodes are connected to each other in series.

4. The integrated circuit of claim 1, wherein the first side of the insulating layer is coated with a reflective material.

5. The integrated circuit of claim 1, wherein the die further comprises:
a conducting layer arranged on an opposite side of the semiconductor layer relative to the insulating layer; and
one or more of an inductance and a capacitance of a power supply arranged on the conducting layer,
wherein the power supply is configured to supply power to the light emitting diodes based on the pulse width modulated pulses output by the control module.

6. The integrated circuit of claim 1, wherein the die further comprises:
Zener diodes arranged adjacent to the first side of the insulating layer,
wherein each of the Zener diodes is connected across a respective one of the light emitting diodes.

7. The integrated circuit of claim 1, wherein the die further comprises:
Zener diodes arranged on the semiconductor layer,
wherein each of the Zener diodes is connected across a respective one of the light emitting diodes.

8. The integrated circuit of claim 1, further comprising:
an integrated circuit packaging,
wherein the die is packaged in the integrated circuit packaging,
wherein the integrated circuit packaging includes a first side and a second side,
wherein the first side of the integrated circuit packaging is adjacent to the light emitting diodes, and
wherein the second side of the integrated circuit packaging (i) is opposite to the first side of the integrated circuit packaging, and (ii) includes an exposed pad.

9. The integrated circuit of claim 8, further comprising:
a heat sink,
wherein the heat sink is arranged adjacent to the second side of the integrated circuit packaging.

10. The integrated circuit of claim 8, wherein a size of the integrated circuit packaging is determined based on a lumens-per-watt rating of the light emitting diodes.

11. The integrated circuit of claim 8, wherein a size of the integrated circuit packaging is inversely proportional to a lumens-per-watt rating of the light emitting diodes.

12. The integrated circuit of claim 8, wherein the light emitting diodes and the control module are integrated in the integrated circuit packaging using a single packaging process.

13. A method comprising:
arranging an insulating layer on a die of an integrated circuit, wherein the insulating layer includes a first side and a second side, and wherein the second side is opposite to the first side;
arranging light emitting diodes on the first side of the insulating layer;

arranging a semiconductor layer on the die of the integrated circuit, wherein the semiconductor layer is adjacent to the second side of the insulating layer;

connecting the light emitting diodes to the semiconductor layer using connections from the first side of the insulating layer to the second side of the insulating layer; and arranging a control module on the semiconductor layer; and outputting pulse width modulated pulses from the control module to the light emitting diodes via the connections.

14. The method of claim 13, wherein the light emitting diodes are un-encapsulated.

15. The method of claim 13, further comprising connecting the light emitting diodes to each other in series.

16. The method of claim 13, further comprising coating the first side of the insulating layer with a reflective material.

17. The method of claim 13, further comprising:
arranging, on the die of the integrated circuit, a conducting layer on an opposite side of the semiconductor layer relative to the insulating layer;
arranging one or more of an inductance and a capacitance of a power supply on the conducting layer; and
supplying power from the power supply to the light emitting diodes based on the pulse width modulated pulses output by the control module.

18. The method of claim 13, further comprising:
arranging, on the die of the integrated circuit, Zener diodes (i) adjacent to the first side of the insulating layer, or (ii) on the semiconductor layer; and
connecting each of the Zener diodes across a respective one of the light emitting diodes.

19. The method of claim 13, further comprising:
determining a size of an integrated circuit packaging to package the die based on a lumens-per-watt rating of the light emitting diodes;
packaging the die in the integrated circuit packaging, wherein the integrated circuit packaging includes a first side and a second side, and wherein the second side of the integrated circuit packaging is opposite to the first side of the integrated circuit packaging;
integrating the light emitting diodes and the control module in the integrated circuit packaging using a single packaging process;
arranging the first side of the integrated circuit packaging adjacent to the light emitting diodes; and
including an exposed pad on the second side of the integrated circuit packaging.

20. The method of claim 19, further comprising arranging a heat sink adjacent to the second side of the integrated circuit packaging.

\* \* \* \* \*